(12) United States Patent  
Ryzhikov et al.

(10) Patent No.: US 7,289,277 B2  
(45) Date of Patent: Oct. 30, 2007

(54) RELAY LENS USED IN AN ILLUMINATION SYSTEM OF A LITHOGRAPHY SYSTEM

(75) Inventors: Lev Ryzhikov, Norwalk, CT (US); Stanislav Smirnov, Bethel, CT (US)

(73) Assignee: ASML Holding N.V., Veldhoven (NL)

( * ) Notice: Subject to any disclaimer, the term of this patent is extended or adjusted under 35 U.S.C. 154(b) by 57 days.

(21) Appl. No.: 10/607,193

(22) Filed: Jun. 27, 2003

(65) Prior Publication Data

US 2004/0008408 A1  Jan. 15, 2004

Related U.S. Application Data

(60) Provisional application No. 60/394,244, filed on Jul. 9, 2002.

(51) Int. Cl.  
*G02B 9/08* (2006.01)

(52) U.S. Cl. .................. 359/740; 359/434; 359/649; 359/726

(58) Field of Classification Search ................ 359/362, 359/434, 435, 649–651, 726, 727, 738–740  
See application file for complete search history.

(56) References Cited

U.S. PATENT DOCUMENTS

| 5,134,522 A | * | 7/1992 | Ueda | 359/642 |
| 5,402,267 A | | 3/1995 | Fürter et al. | |
| 6,304,389 B1 | * | 10/2001 | Shibayama | 359/689 |
| 6,366,410 B1 | * | 4/2002 | Schultz et al. | 359/649 |
| RE38,438 E | * | 2/2004 | Takahashi | 359/727 |
| 2002/0036832 A1 | * | 3/2002 | Schultz et al. | 359/649 |
| 2003/0053218 A1 | * | 3/2003 | Fujimoto et al. | 359/656 |

FOREIGN PATENT DOCUMENTS

| EP | 0869 383 A2 | 10/1998 |
| EP | 1001 314 A2 | 5/2000 |
| EP | 1115 019 A2 | 7/2001 |
| EP | 1 235 112 A2 | 2/2002 |
| WO | WO 98/28644 * | 7/1998 |
| WO | WO 02/14924 A1 | 2/2002 |

OTHER PUBLICATIONS

European Search Report for Appl. 3015468.6-2217—mailed Jan. 22, 2004.  
Office Action from European Patent Office Dated Jul. 2, 2004 for European Patent Application No. 03 015 468.6-2217.  
Austrian Search Report for Singapore Appln. 200304198-5 mailed Mar. 26, 2004.

* cited by examiner

*Primary Examiner*—Joshua L Pritchett  
(74) *Attorney, Agent, or Firm*—Stern, Kessler, Goldstein & Fox PLLC

(57) ABSTRACT

A relay lens is provided in an illumination system for use in microlithography. The relay lens can be used to uniformly illuminate a field at a reticle by telecentric light beams with variable aperture size. The relay lens can include first, second, and third lens groups. At least one of the second and third lens groups can include a single lens. This can reduce costs and increase transmission by requiring less $CaF_2$ because fewer optical elements are used compared to prior systems.

12 Claims, 4 Drawing Sheets

RELAY LENS USED IN AN ILLUMINATION SYSTEM OF A LITHOGRAPHY SYSTEM

CROSS-REFERENCE TO RELATED APPLICATIONS

Figure 1:
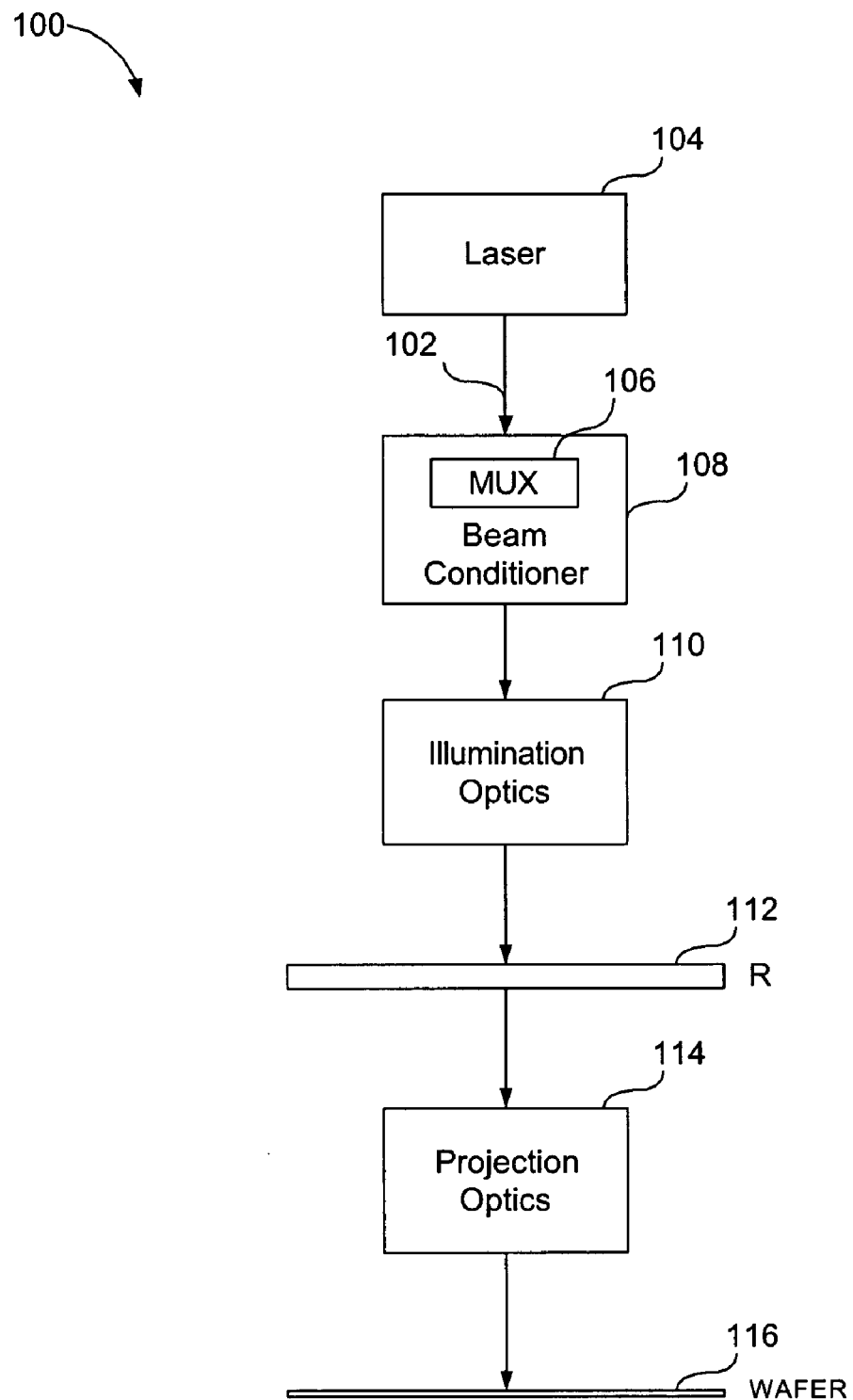

The application claims the benefit under 35 USC 119(e) to U.S. Prov. Appl. No. 60/394,244, filed Jul. 9, 2002, which is incorporated by reference herein in its entirety.

BACKGROUND OF THE INVENTION

1. Field of the Invention

The invention relates to a system and method for sharply illuminating a predetermined region of a reticle during exposure.

2. Background Art

A relay objective (e.g., lens) or a reticle edge masking assembly (REMA) objective (e.g., lens) is an objective that images an intermediate plane onto a plane of a reticle. The reticle supports a mask for lithography. By using the relay lens, the region illuminated on the reticle is sharply defined. Usually, the reticle masking device is assembled with adjustable edges. Conventionally, the relay lens is utilized in microlithographic exposure systems, steppers, or scanners, although the relay lens can be used in other optical systems. Diaphragm edges, which lie in the object plane of the relay lens, must be imaged precisely onto the reticle plane. An exposed corrected pupillary intermediate image is often desired because then, at the location of the intermediate image, further diaphragms and the like can be mounted, for example, to mask parts of an alignment system.

Typically, relay lens systems have very complicated structures (e.g., from about 7 to 10 lens elements). These optical systems have high Numerical Aperture (NA) (e.g., about 0.6 to 0.7). Basically, these systems include of three parts: a front portion (this part decreases NA), an intermediate portion (for pupil aberration and pupil shape correction) and a field portion (to create essential field size on the reticle). Following the relay lens system in a lithography tool is a projection objective, which normally operates in reduction and can include an inner-lying pupillary plane for non-telecentric input. A wafer follows in an image plane. An additional task of the relay lens system is to correct telecentricity on the reticle.

Conventional systems have a plurality of the optical elements in each of the above-mentioned front, intermediate, and field parts. The front part has 3-4 lenses, the intermediate part has 2-4 lenses, and the field part has 2-4 lenses. Conventional relay lens systems have several disadvantages because of the plurality of the optical elements in each part, these are: (1) a large volume of $CaF_2$ is needed for 157 nm lithography systems, which is quite costly; (2) there is low transmission caused by not only glass absorption, but also reflectance on each lens surface; (3) there are alignment difficulties because too many lenses are required to be aligned, and (4) there is high cost due partially to the large volume of $Ca F_2$ required. These high costs are then passed on to purchasers of the systems, which can make purchasing additional or newer systems prohibitive.

What is needed is a relay lens that is a simpler, a less complex design, and that reduces costs involved in manufacturing, and thus in customer costs, which can all be achieved by reducing optical elements in the relay lens.

BRIEF SUMMARY OF THE INVENTION

A relay lens is provided in an illumination system, possibly for use in lithography. The relay lens can be used to uniformly illuminate a field at a reticle by telecentric light beams with variable aperture size. The relay lens can include first, second, and third lens groups. At least one of the second and third lens groups can include a single lens. This can reduce costs and increase transmission by requiring less $CaF_2$ because fewer optical elements are used compared to prior systems.

Some advantages of embodiments of the present invention over conventional systems are simplicity of design and manufacture and reduced costs of manufacture based on reducing an amount of optical material (e.g., fewer optical elements, and thus fewer optical surfaces) to reduce the amount of $CaF_2$ required. This is done without effecting optical output of the illuminating system or the relay lens. A lower volume of the $CaF_2$ can be used (e.g., about 30-50% lower) than conventional systems. There is a higher transmission (e.g., about 30% higher) than conventional systems. Alignment difficulties are virtually eliminated because only one lens may be used in certain parts. The relay lens system is less expensive than conventional systems, while producing the same image quality.

Still other advantages of the embodiments of the present invention is that it has a simpler structure than conventional systems because intermediate and field groups can include of single lens elements, instead of plurality of the lens elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 shows an example lithography system according to embodiments of the present invention.

Figure 2:
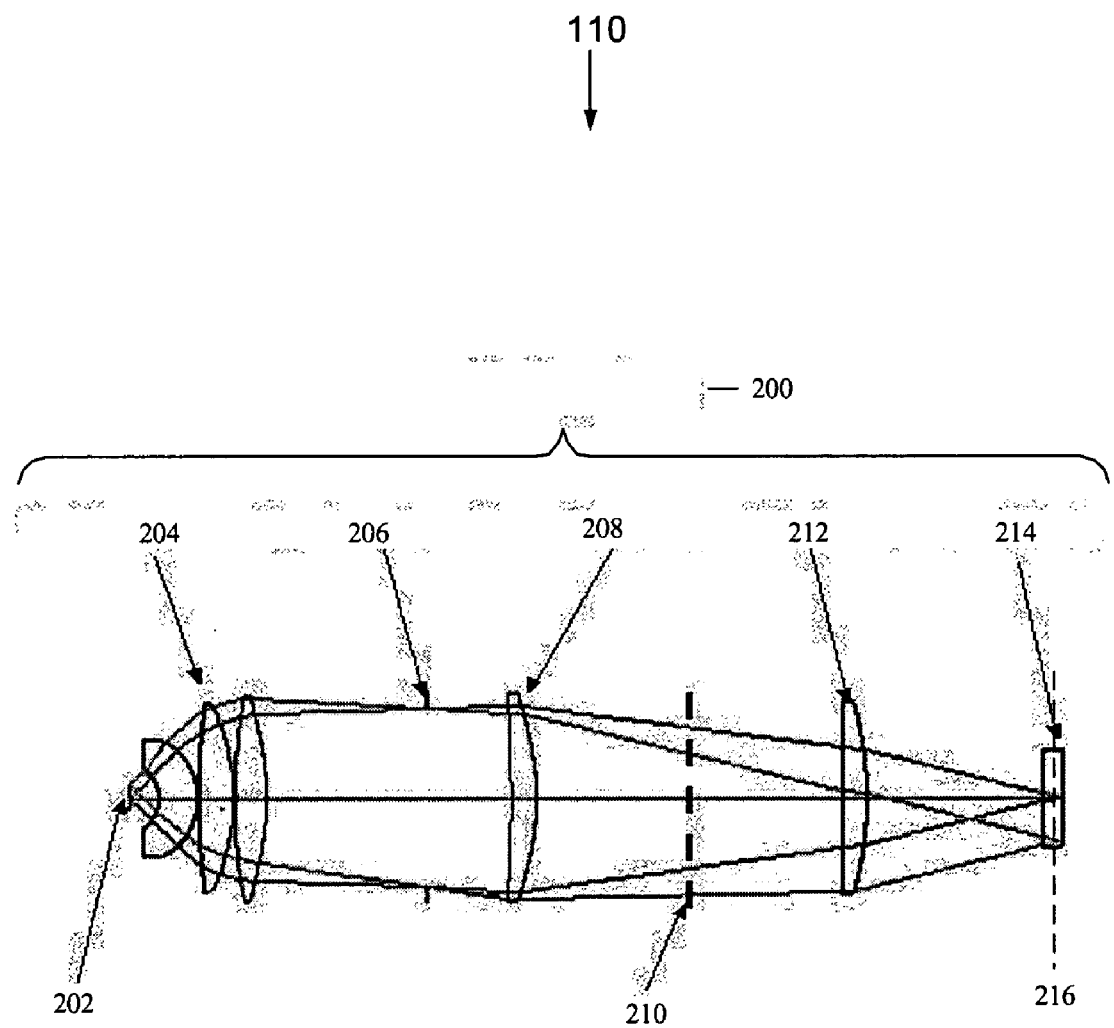
Figure 3:
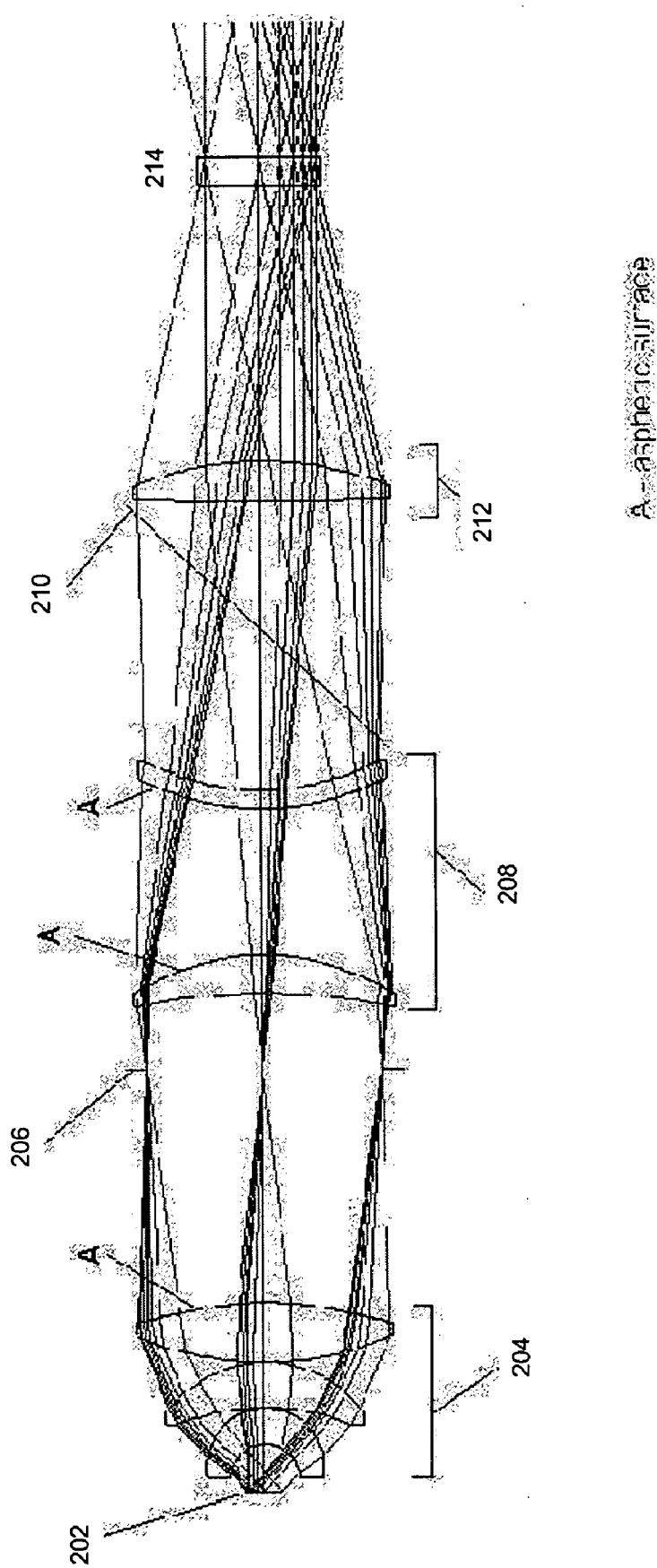
Figure 4:
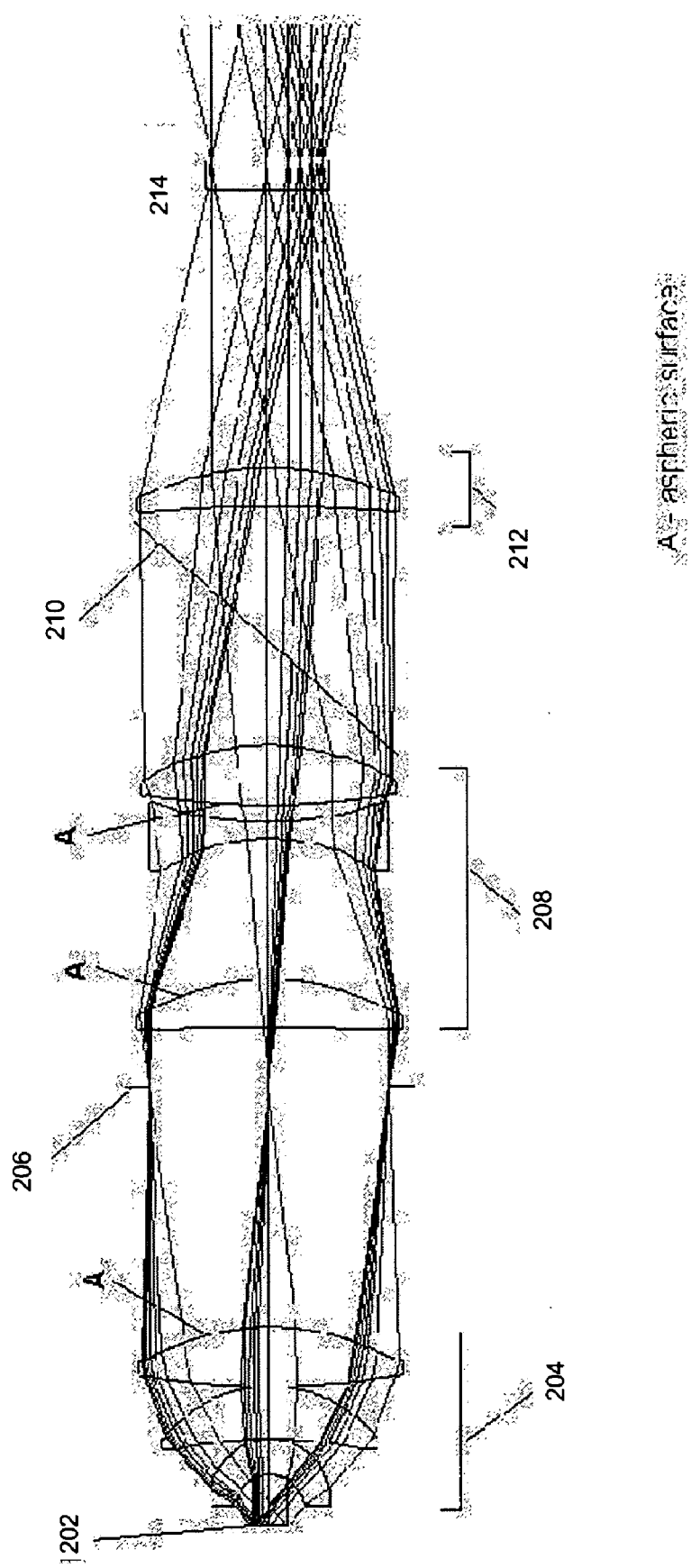

FIGS. 2, 3, and 4 show example relay lens systems or REMA objective lens systems in the lithography system of FIG. 1.

The present invention will now be described with reference to the accompanying drawings. In the drawings, like reference numbers may indicate identical or functionally similar elements. Additionally, the left-most digit(s) of a reference number can identify the drawing in which the reference number first appears.

DETAILED DESCRIPTION OF THE INVENTION

FIG. 1 shows a system 100 that interacts with light 102 during exposure of a substrate 116 (e.g., a wafer) according to embodiments of the present invention. A light source 104 (e.g., a laser) can be an excimer or deep UV excimer laser, for example. In some embodiments, a multiplexer 106 in beam conditioner 108 receives light 102. The beam conditioner 108 outputs light to illumination optics 110, which in turn transmits light through a mask or reticle 112 onto a substrate (e.g., wafer) 116 via projection optics 114. One embodiment for this system can be a lithography system, or the like. Another embodiment can be a holography system.

FIG. 2 shows a relay lens 200 in illuminating optics 110, according to embodiments of the present invention. Relay lens 200 includes a delimiter plane 202, a first lens group 204 (e.g., a front portion), an aperture stop 206 (e.g., a variable aperture stop), a second lens group 208 (e.g., an intermediate portion), a fold mirror 210, a third lens group 212 (e.g., a field portion), and a reticle 214 having a reticle plane 216. First lens group 204 can include a meniscus lens and a lens with an aspherical surface. In the embodiments shown in FIG. 2, second and third lens groups 208 and 212 each have only a single lens element. Second lens group 208 can have a single lens with one aspherical surface, which can be a convex surface. Third lens group 212 can have a single lens that has a spherical surface.

With continuing reference to FIG. 2, first lens group 204 (e.g., a front portion of relay lens 200) includes three lenses: a front thick meniscus lens with a first surface concentric to an object axial point, which can be used for Petzval sum correction, and two other lenses, which can be used for NA decrease. Second lens group 208 (e.g., an intermediate portion of relay lens 200) includes one lens (or two to three lenses in the embodiments shown FIGS. 3-4 discussed below) with an aspheric surface. This one lens in second lens group 208 is located after aperture stop 206 and it can perform one or more of the following functions: pupil aberration correction, pupil shape correction (ellipticity), and telecentricity correction in the reticle space. Third lens group 212 (e.g., a field portion of relay lens 200) can include one lens. This one lens in third lens group 212 can perform one or more of the following functions: creating essential field size at the reticle plane and if, this lens has an aspheric surface, correcting telecentricity.

Again, with reference to FIG. 2, in operation, a light bean is received at delimiter plane 202 and expanded and collimated with first lens group 204. A size of the expanded and collimated beam can be controlled by aperture stop 206. A focus position on reticle 214 of the expanded and collimated beam can be controlled by second lens group 208, third lens group 212, or both second and third lens groups 208 and 212.

To manufacture relay lens 200 in a more compact and economical manner, a folding mirror 210 can be used. In some embodiments it can be optional. Relay lens 200 images delimiter plane 202 onto reticle plane 216 with a predetermined magnification. Telecentric beams from delimiter plane 202 can be converted to telecentric beams on reticle 214. Relay lens 200 can provide uniformity of illumination of the reticle plane and non-ellipticity of pupil shape.

In one example, a relay lens 200 can be constructed according to the following data:

| Surface # | Surface Type | Y Radius | Thickness | Glass | Refract Mode | Y Semi-Aperture |
|---|---|---|---|---|---|---|
| Object | Sphere | Infinity | 40.5759 | | Refract | 0 |
| 1 | Sphere | −38.8954 | 48.5861 | CaF2 | Refract | 34.3792 |
| 2 | Sphere | −70.4454 | 1.0000 | | Refract | 64.7896 |
| 3 | Asphere | 1056.8762 | 55.0000 | CaF2 | Refract | 103.1220 |
| 4 | Sphere | −175.1412 | 1.0000 | | Refract | 108.0828 |
| 5 | Sphere | 336.3331 | 37.7241 | CaF2 | Refract | 120.1833 |
| 6 | Asphere | −840.2127 | 13.6072 | | Refract | 119.9937 |
| 7 | Sphere | Infinity | 84.3426 | | Refract | 119.5076 |

-continued

| Surface # | Surface Type | Y Radius | Thickness | Glass | Refract Mode | Y Semi-Aperture |
|---|---|---|---|---|---|---|
| 8 | Sphere | Infinity | 133.4129 | | Refract | 117.1521 |
| Stop | Sphere | Infinity | 55.9768 | | Refract | 113.4723 |
| 10 | Sphere | 1784.7806 | 35.1455 | CaF2 | Refract | 122.2680 |
| 11 | Asphere | −339.0580 | 93.6409 | | Refract | 123.0736 |
| 12 | Sphere | Infinity | 310.7213 | | Refract | 119.7255 |
| 13 | Sphere | Infinity | 85.0612 | | Refract | 110.6886 |
| 14 | Sphere | 417.5797 | 31.2151 | CaF2 | Refract | 107.8689 |
| 15 | Sphere | −1616.3317 | 224.6563 | | Refract | 106.3382 |
| 16 | Sphere | Infinity | 28.3500 | CaF2 | Refract | 56.8430 |
| 17 | Sphere | Infinity | 0.0000 | | Refract | 53.0694 |
| Image | Sphere | Infinity | 0.0000 | Air | Refract | 53.0694 |

Depending on the specifications of system 100, it is possible in alternative embodiments of the present invention that only one of second lens group 208' or 208" and the third lens group 212 may have only one lens. Although, preferably both the second and third lens groups 208 and 212, respectively, have only one lens each. When specifications dictate either second or third lens group 208 or 212, respectively, to have more the one lens, preferably, third lens group 212 will continue to have only one lens. FIGS. 3 and 4 show two possible example alternative configurations.

In FIG. 3, he second lens group 208' has two lenses, which can have at least one aspheric surface on each lens.

In FIG. 4, second lens group 208" has three lenses. At least two of the three lenses in second lens group 208" can have at least one aspheric surface.

Even in these alternative embodiments dictated by desired specifications of system 100, relay lens 200 can continue to have fewer optical elements compared to conventional systems, which keeps the cost down. It is to be appreciated that still other configurations based on other desired specifications are possible, and all are contemplated within the scope of the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A relay lens system positioned between a delimiter plane and a pattern generator plane of a lithography system, comprising:

a first lens group comprising three lenses that decrease numerical aperture of a received beam of radiation;

a second lens group having at least one lens that receives the beam of radiation from the first lens group and controls characteristics of the beam of radiation at a pupil plane;

a third lens group consisting of a single lens element made from a single material having a single index of refraction that receives the beam of radiation from the second lens group and controls field characteristics of the beam of radiation at a patterning device plane;

an aperture stop positioned between the first and second lens groups; and a fold mirror positioned between the second and third lens groups.

2. The system of claim 1, wherein the second lens group consists of two lenses.

3. The system of claim 1, wherein the second lens group consists of three lenses.

4. The system of claim 1, wherein one of the three lenses in the first lens group is a meniscus lens.

5. The system of claim 1, wherein two of the three lenses in the first lens group are biconvex lenses.

6. The system of claim 5, wherein one of the two biconvex lenses has an aspherical surface.

7. The system of claim 1, wherein the at least one lens in the second lens group has at least one aspherical surface.

8. The system of claim 1, wherein the at least one lens in the second lens group has at least one convex surface.

9. The system of claim 1, wherein the single lens in the third lens group comprises two spherical surfaces.

10. The system of claim 1, further comprising:

a light source positioned before the first lens group; and a pattern generator positioned after the third lens group in the pattern generator plane.

11. The system of claim 1, wherein the characteristics controlled by the second lens group comprise at least one of pupil aberration correction, pupil shape correction, elipticity correction, and telecentricity correction.

12. The system of claim 1, wherein the field characteristics controlled by the third lens group comprises at least one of creating a desired field size at the pattern generator plane and correcting telecentricity.

* * * * *